United States Patent [19]
Anderson

[11] Patent Number: 5,552,709
[45] Date of Patent: Sep. 3, 1996

[54] NMR SAMPLE CELL

[75] Inventor: Weston A. Anderson, Palo Alto, Calif.

[73] Assignee: Varian Associates, Inc., Palo Alto, Calif.

[21] Appl. No.: 544,222

[22] Filed: Oct. 17, 1995

[51] Int. Cl.⁶ .................................................. G01V 3/00
[52] U.S. Cl. ............................................ 324/321; 324/318
[58] Field of Search .................................. 324/321, 318, 324/322, 307, 309, 314; 128/653.5

[56] References Cited

U.S. PATENT DOCUMENTS

| | | | |
|---|---|---|---|
| 4,551,678 | 11/1985 | Morgan et al. | 324/321 |
| 5,469,061 | 11/1995 | Linehan et al. | 324/321 |

OTHER PUBLICATIONS

"Multi–Cloistered" NMR Cells by E. M. Banas, Applied Spectroscopy, vol. 23 No. 1 1969 pp. 281–282.

*Primary Examiner*—Louis M. Arana
*Attorney, Agent, or Firm*—Gerald M. Fisher; Edward Berkowitz

[57] ABSTRACT

The present invention relates to improving the sensitivity of an NMR system for electrically conductive (polar) NMR samples. Many NMR samples use water or a salt solution of water or other electrically conductive liquid as a solvent for biologically active materials. When such a sample is placed in the probe coil of an NMR spectrometer, electrical losses in the conductive material lowers the Q of the receiving circuit and thereby reduces the sensitivity of the spectrometer. These electrical losses can be greatly reduced by breaking up the current paths within the sample. This can be achieved by a special sample cell that compartmentalizes the sample with electrical insulating material reducing the electrical current paths.

8 Claims, 6 Drawing Sheets

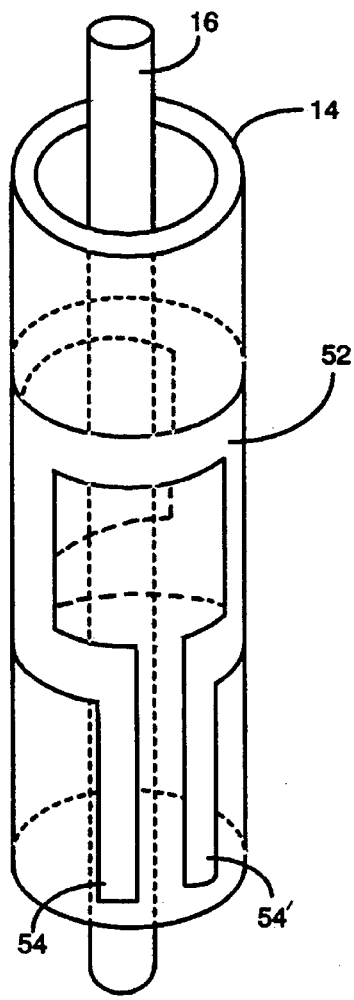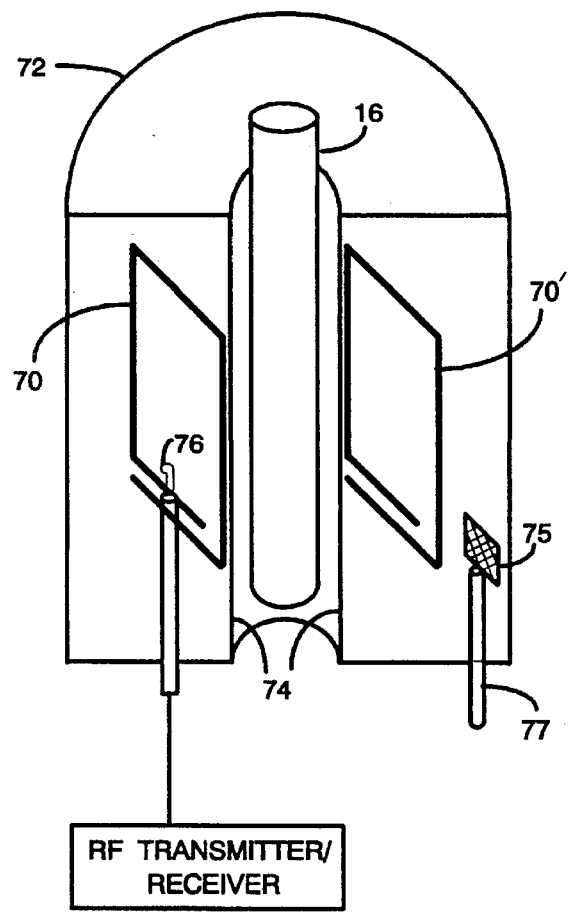
FIG. 2A
PRIOR ART
FIG. 2B
PRIOR ART

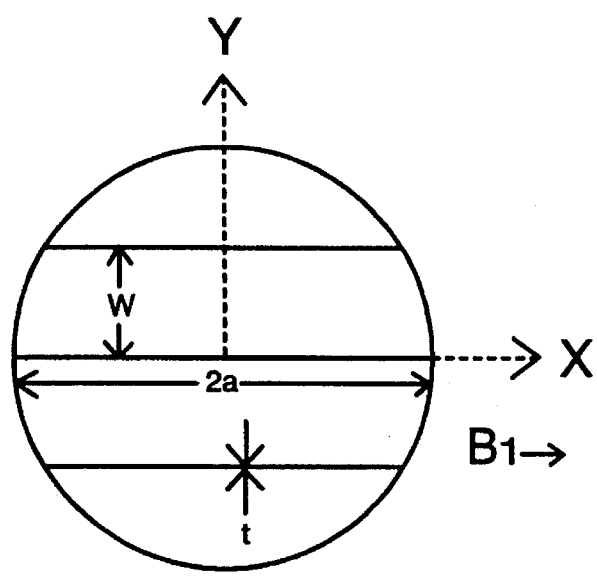
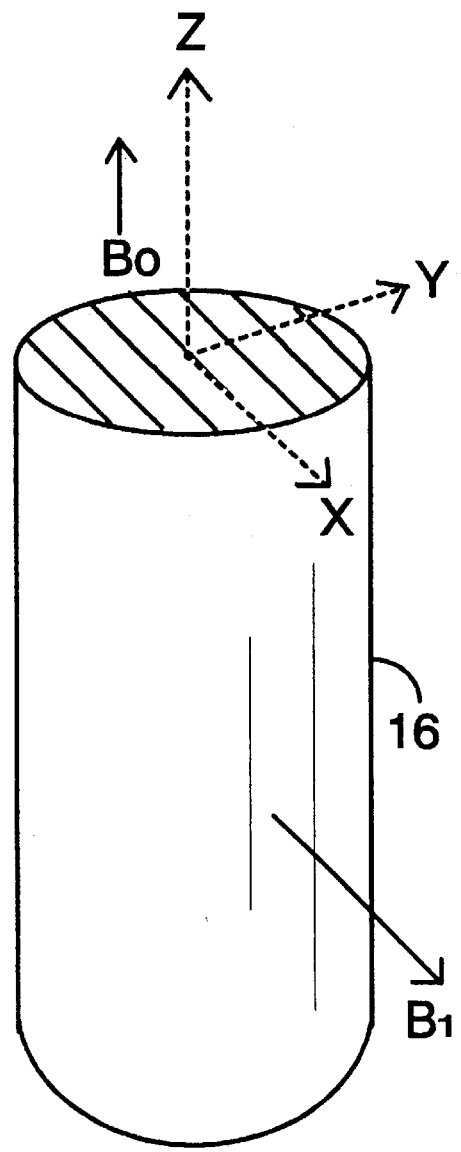
FIG. 5A
FIG. 5B

NMR SAMPLE CELL

FIELD OF THE INVENTION

This invention relates to Nuclear Magnetic Resonance (NMR) sample cells and techniques for improving sensitivity of an NMR probe coupling to a sample.

BACKGROUND OF THE INVENTION

NMR is a well established technique for chemical analysis. It is based upon the fact that atomic nuclei have magnetic moments and angular momentum or spin. When the nuclei are placed in a strong, uniform, and constant magnetic field they tend to line up with the field to give a net magnetization. When the magnetization is reoriented, it will precess about the direction of the strong magnetic field at a frequency called the Larmor frequency. This frequency is proportional to the magnetic field strength. The frequency will depend to a smaller extent upon the position and environment of each nuclei in a molecule, making NMR spectroscopy an extremely powerful technique for the determination of molecular structure. Typical NMR nuclei include $^1H$ (protons), $^{13}C$ (carbon), $^{19}F$ (fluorine) and $^{31}P$ (phosphorous).

Normally the sample material to be analyzed in an NMR instrument is dissolved by a solvent and placed into a sample tube. The sample tube is inserted into a probe which contains a transmitter coil that is excited with radio frequency energy that is used to tip the nuclear magnetization away from the direction of the magnet field and to cause the start of the precession. The precessing magnetization induces a voltage in the receiver coil of the probe which is coupled to an amplifier and detector circuits. In most modern NMR spectrometer equipment, the receiver and transmitter are turned on and off very quickly so that the receiver is off when the transmitter is on, and vice versa so that a single coil is used which is known as the transmit/receive coil or the probe coil.

The sensitivity of an NMR spectrometer depends upon many factors including the magnetic field strength, the quality factor Q of the receiver coil used to pick up the precessing magnetization and the degree of coupling (characterized by the filling factor) between the probe coil and the NMR sample and thermal noise contributed by the sample material. To achieve the highest magnetic fields modern spectrometers use superconducting magnets operating at field strengths as high as 17 tesla. For proton resonance, the typical Q of the receiver coil is in the range of 400–500 for coils using normal conductors. Recently spectrometers have been built using receiver coils made of High Temperature Superconductor (HTS) materials that have Q's approximately 100 times higher, i.e. up to 50,000. With coil Q's in this range the loading by the sample becomes significant for somewhat lossy samples reducing the overall Q and sensitivity of the spectrometer. The purpose of this invention is to decrease the loss of Q due to the sample material without substantially reducing the filling factor and thereby enabling an increase in sensitivity.

OBJECT OF THE INVENTION

It is an object of the invention to improve the sensitivity of an NMR spectrometer.

It is a further object of this invention to provide an improved sample cell.

It is a further object of this invention to provide an improved sample cell which reduces the dielectric loss due to the electrical conductivity of the sample.

BRIEF DESCRIPTION OF THE DRAWINGS

FIG. 2A is a partial sketch of a prior art NMR probe with an ambient temperature probe coil in relation to an NMR sample tube.

FIG. 2B is a sketch of a prior art NMR probe with a superconducting RF probe coil.

FIG. 5A is a sketch of the top view of a sample cell incorporating 4 compartments with walls parallel and elongated in the direction of the RF field $B_1$.

FIG. 5B is a sketch of a sample cell incorporating 8 compartments elongated in the direction of the RF field B1.

DETAILED DESCRIPTION OF THE INVENTION

Figure 1:
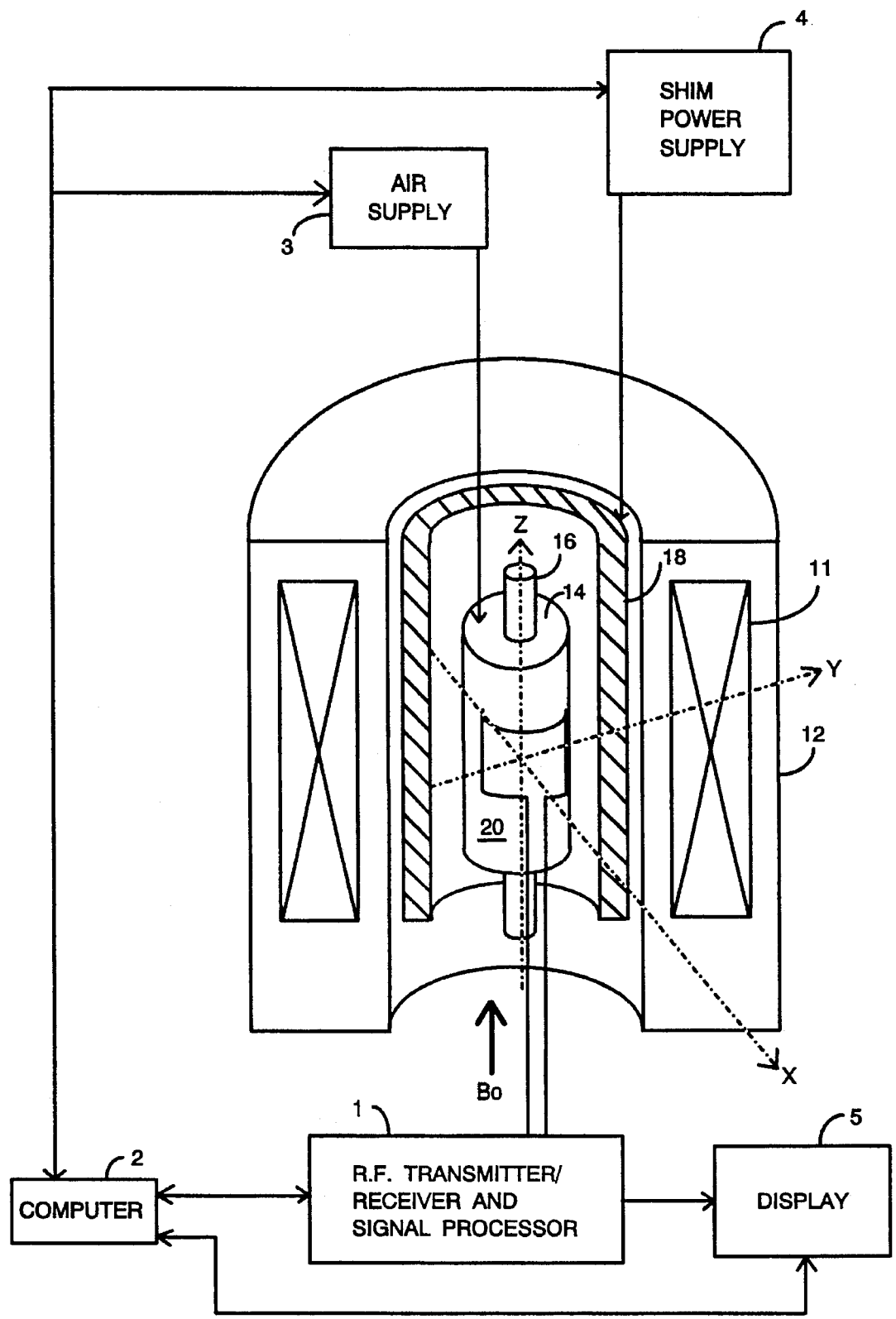
FIG. 1 is a schematic of a prior art NMR spectrometer system.

This invention is related to high resolution NMR spectroscopy, and in particular to high resolution NMR systems utilizing a superconducting magnet. Typically, modern NMR spectrometers use superconducting magnets to achieve high magnetic field strengths. The higher fields and the corresponding increase in the NMR resonance frequencies can achieve greater sensitivity permitting chemists to examine more dilute samples. FIG. 1 is a sketch of a NMR spectrometer employing such a superconducting magnet. Magnet coil 11 enclosed in Dewar 12 produces a vertical magnetic field $B_o$ along the Z-axis within the bore of the magnet. Normally liquid helium is contained in the Dewar to maintain the coils near 4.2 degrees Kelvin. The NMR probe 14 located in the magnet bore receives and holds the sample tube 16 which is also aligned along the Z-axis. The sample tube 16 may be spun by an air turbine (not shown) located in probe 14 by air supply 3. In some experiments spinning of the sample tube produces undesired artifacts so electrical current shims 18 connected to power supply 4 are used to remove undesired gradients. RF coil 20 serves both the transmit and receive functions and is connected to the transmitter/receiver 1. This RF coil is also known as the probe coil. The spectrometer, including the RF transmitter/ receiver and signal processor 1, display unit 5, air supply 3 and shim power supply 4 are controlled by a computer 2.

The spectrometer probe 14 may be one of several different types. FIG. 2A is a partial sketch of a prior art NMR probe incorporating an ambient temperature saddle probe coil 52. Leads 54, 54' couple the coil to the transmitter/receiver portion of the NMR spectrometer. The ambient temperature probe coil 52 is designed to operate near room temperature. Generally the coil is fabricated from copper, aluminum or silver or a combination of these metals. The typical quality factors or Q of the coil is in the range of several hundred. Sample tube 16 is positioned at the center of coil 52 to enhance the coupling between the sample material in the tube 16 and the coil.

NMR probes have also been constructed using cooled coils of normal metals that operate in the temperature range of 77° K. and lower. The advantage of low temperature probe coils is that such coil has lower electrical losses and thus a higher Q and is capable of increasing spectrometer sensitivity. They also produce less thermal noise because of the lower temperature of the probe coil. However, high resolution NMR spectrometers generally are designed to operate with liquid samples, commonly using water as a solvent so that the sample must be kept near room temperature. Accordingly, a Dewar or other thermal isolation means is provided to produce the necessary temperature isolation between the sample and such low temperature probe coil.

Recently, probes have been constructed with probe coils made from High Temperature Superconducting (HTS) materials. These superconducting materials have extremely low electrical losses and thereby provide coils with very high Q's, in the range of several thousand to 50,000 or more. For the existing HTS materials, the coils must be cooled generally below 90° K. to enter their superconducting state, and the performance generally improves at even lower temperatures. Typical operating temperature for a currently available superconducting probe is below 40° K. FIG. 2B is a sketch of a prior art NMR probe employing a HTS probe coil. HTS coils 70 are resonant at the NMR frequency and coupled to the sample material within sample tube 16. To maintain good thermal isolation between the HTS coils, 70 and 70', and the sample tube, a Dewar wall 74 is placed between probe coils 70, 70' and sample tube 16. Coupling loop 76 provides the connection between the coils and the transmitter/receiver 1 of the NMR spectrometer. The extra space required by thermal isolation wall 74 reduces the filling factor η of coil 70, causing some reduction in sensitivity but this is more than compensated by the higher Q of HTS coils 70, 70'. An adjustable tuning paddle 75 is used to tune the coil to the spectrometer transmitter/receiver frequency and the Larmore frequency of the sample material.

When operating with such high Q values i.e. in the range of 10,000 and above, the energy losses in the sample being analyzed can greatly reduce the overall Q and reduce the sensitivity of the measurement. Both the probe coil and the sample generate thermal noise which is coupled to the NMR receiver and limits the sensitivity of the spectrometer. The relative noise power contribution from each of these sources is proportional to their respective temperatures and in proportion to their coupling to the NMR receiver. Since for most experiments the sample is maintained near room temperature, the noise power contribution of the sample can be substantial and it reduces the overall Q of the sample-coil combination. The purpose of this invention is to reduce such losses that come from the sample and its solvent.

The energy losses in the sample arise from several mechanisms. First, RF energy is coupled by capacitance between the probe coil and the sample material. In those instances where the sample has a high electrical conductivity, RF currents will flow through the sample and cause Joule heating. Second, oscillating magnetic fields in the probe coil induce electrical currents in the sample which also cause Joule heating.

The first mechanism can be reduced by use of a Faraday shield. Both the first and second mechanism can be reduced by reducing the effective conductivity of the sample itself. According to this invention, this is accomplished by using a special sample cell which limits the current paths within the sample, thereby reducing the electrical loss caused by the sample.

Most non-polar materials have very low electrical conductivity and do not contribute to this problem. However, many materials cannot be dissolved in non-polar solvents, and particularly many biologically active samples change their properties if not dissolved in water based solution. The pH and salt concentration may have to be adjusted to a suitable range to yield the desired properties or conformation of a biologically active material. The problem arises because alcohols, water, and particularly a salt solutions and other polar solvents have high electrical conductivity. This problem becomes more acute at higher frequencies for polar materials since their conductivity generally increases as a function of frequency. This problem is further complicated because the value of the conductivity of different polar solvent materials vary widely and can produce changes in spectrometer sensitivity with a change of solvents.

To aid in the understanding of this problem and to develop and optimize a solution, the following analysis has been developed. The probe quality factor Q including the RF probe coil and sample losses can be represented by the following equations:

$$\frac{1}{Q} = \frac{P}{\omega W} = \frac{Pc + Ps}{\omega W} \quad (1)$$

$$\frac{1}{Qs} = \frac{Ps}{W} \quad (2)$$

$$\frac{1}{Q} = \frac{1}{Qc} + \frac{1}{Qs} \quad (3)$$

where $P$ = total power loss
$\omega$ = angular frequency of the RF field
$W$ = total energy stored by the coil
$Pc$ = power loss of the RF coil
$Ps$ = power loss of the sample
$Qc$ = coil quality factor
$Qs$ = sample quality factor The energy stored by the RF probe coil, $W$, is given by $$W = \frac{1}{2\mu_0} \int_{\text{all volume}} B_1^2 dV = \quad (4)$$

$$\frac{1}{2\eta \mu_0} \int_{\text{sample volume}} B_1^2 dV = \frac{B_1^2 V}{2\eta \mu_0}$$

The RF magnetic field is assumed to be uniform over the sample volume permitting the $B_1$ term to be removed from under the second integral. Here $\mu_0 = 4\pi \times 10^{-7}$ H/m is the permittivity of free space which includes the sample and the sample cell, and η is the filling factor of the sample. With a cylindrical sample tube or sample cell of radius a and length L, the sample volume $V=\pi a^2 L$ $$w = \frac{\pi a^2 L B_1^2}{2\eta \mu_0} \quad (5)$$

The power lost in the sample Ps is found by solving the equation $$Ps = \int_{\substack{\text{sample} \\ \text{volume}}} J \cdot E dV = \sigma \int_{\substack{\text{sample} \\ \text{volume}}} E^2 dV \quad (6)$$

where $\sigma$ is the electrical conductivity of the sample and the current density $J=\sigma E$. The RF magnetic field $B_1$ directed along the X-axis produces an electric field E within the sample causing a current to flow within the sample. The electric field found from Maxwell's equation $\Delta \times E = -\dot{B}$. The back reaction, i.e. reaction to the Joule currents and displacement currents can be safely ignored.

For finding the loss in a cylindrical sample volume of radius a, we use cylindrical coordinates so that $B_r = B_1 \cos \omega t \cos \phi$ $B_\phi = -B_1 \cos \omega t \sin \phi$ $B_z = 0$ and $E = E_z = \omega B_1 r \sin \omega t \sin \omega$.

With a long sample, i.e. L>>a the end effects can be ignored and the currents induced into the sample will flow up along one side of the sample and down on the other side. At the top and bottom of the sample tube or cell the currents have an X-component and cross over from one side of the cell to the other to form continuous loops. These currents cause the Joule heating and the loss of Q of the receiver input circuit. As explained more fully below, larger sample tubes or sample cell compartments permit larger currents to flow since a greater amount of RF magnetic flux is enclosed by the current loops: These larger currents produce more Joule heating and loss of Q.

For a single cylindrical tube of radius a and length L equation (6) is integrated to yield $$\begin{aligned}
Ps &= \sigma \int_{\substack{\text{sample} \\ \text{volume}}} E_z^2 dV \quad (7)\\
&= \sigma \omega^2 B_1^2 <\sin^2 \omega t> \int_0^a r^3 dr \int_0^{2\pi} \sin^2 \phi d\phi \int_{-L/2}^{L/2} dz\\
&= \frac{\pi}{8} \sigma \omega^2 B_1^2 L a^4
\end{aligned}$$

The average $<\sin^2 \omega t> = \frac{1}{2}$. Inserting Eqs. 7 and 5 into Eq. 2 gives $$Qs = \frac{4}{\eta \mu_0 \omega a^2 \sigma} \quad (8)$$

To illustrate the effect of the filling factor upon the sensitivity of NMR. spectrometers consider two different probes, both operating at 600 MHz and both having a sample volume that will accommodate a 5 mm OD sample tube or sample cell. The inside diameter of such a sample tube typically is 4.2 mm, i.e. a=2.1 min. The first probe is in common use today and uses a probe coil of copper and operated at ambient temperature TA=300K and has a coil Qc=300 and a filling factor $\eta=\eta_1=0.5$. The second probe uses the relatively new High Temperature Superconducting (HTS) material Yttrium Barium Copper Oxide C/BCO) material and operates at a low temperature TL=25K and has a coil QCL=10,000. Because of the low operating temperature of this probe coil thermal isolation between it and the samples lowers the filling factor to $\eta=\eta_L=0.25$. For these two cases, Eq. 8 yields ambient coil $Q_{SA} = \frac{383}{\sigma}$ and for low temperature $\quad (9)$ superconductor coil $Q_{SL} = \frac{766}{\sigma}$ respectively.

where $\sigma$ is the electrical conductivity of the sample in units of mhos/m. The sample Q of the low temperature probe QSL is higher because of its smaller filling factor.

To compare the performance of these two probes with sample cells made in accordance with this invention, first the performance will be computed for each system using the prior art single tube to contain the sample. The performance will be evaluated for several solvent materials. The Signal to Noise ratio (SNR) is perhaps the best performance measure of the relative sensitivity. Here we define SNR to be a parameter which is proportional to the true signal to noise ratio, but leaves out the factors that are common. It includes the effect of the coil temperature since temperature, in part, determines the noise generated by the probe coil. The sample temperature Ts also contributes the noise in the losses due to its electrical conductivity. The SNR is defined by $$SNR = \frac{2\eta}{\sqrt{\frac{Tc}{Qc} + \frac{Ts}{Qs}}} . \quad (10)$$

The ambient temperature probe operates with a coil temperature and sample temperature both at 300K, i.e. Tc=Ts=300K and Qc=300. With the HTS coils operating at 25K with a $Q_L$=10,000 and with $Q_{SL}=2Q_{SA}$. With these various substitutions the equations for the relative signal to noise ratio of the two probes, ambient $SNR_A$ and low temperature $SNR_L$ can be written as follows:

$$SNR_A = \frac{1}{\sqrt{1 + \frac{300}{Q_{SA}}}} \text{ and} \quad (11)$$

$$SNR_L = \frac{10}{\sqrt{1 + \frac{6 \times 10^4}{Q_{SA}}}} .$$

Table I gives the SNR as determined by Eqns. 11 for the two probes at 600 MHz with a cylindrical sample tube for several solvents of differing electrical conductivity; $\sigma$. The values of the solvent conductivity, $\sigma$ were calculated from formulas and values given in the book *Electric Materials and Applications*, edited by Arthur R. Von Hippel; The Technology Press of MIT and John Wiley & Sons, Inc., New York, (1954) pgs. 361-2 for materials, pg. 294 for the formula. The dielectric constant and loss tangent values were given for solvents at 300 MHz. To apply at 600 MHz the conductivity values were multiplied by 2 as indicated by the Von Hippel formula. This is an approximation based on the assumption that the dielectric constant and loss tangent at 600 Mhz are approximately the same as at 300 Mhz.

TABLE I

SNR expected from simple sample tube for various solvents.

| Solvent | σ (mhos/m) | QsA | SNR of normal probe | SNR of Low Temp. probe |
|---|---|---|---|---|
| C Cl4 | $7.2 \times 10^{-6}$ | $5.3 \times 10^{-7}$ | 1.00 | 10.00 |
| Water (pure) | $4.1 \times 10^{-2}$ | 9,300 | 0.98 | 3.66 |
| Methanol | $8.2 \times 10^{-2}$ | 4,600 | 0.97 | 2.68 |
| Ethanol | 0.2 | 1,900 | 0.93 | 1.76 |
| 0.1M NaCl | 2.0 | 190 | 0.63 | 0.57 |
| 0.3M NaCl | 5.7 | 67 | 0.43 | 0.34 |
| 0.5M NaCl | 9.0 | 43 | 0.35 | 0.27 |

The conclusions to be drawn from Table I is that both probes lose considerable SNR for samples using conductive solvents as might be used in the analysis of biologically active materials. For the highly conductive salt solutions the low temperature probe actually does worse than an ambient temperature probe because of its smaller filling factor. Solvent conductivities are approximately proportional to frequency and the Q is inversely proportional to the product conductivity and frequency, so the Q is inversely proportional to the square of the frequency. For highly conductive samples, such as biological materials in a NaCl solution, the SNR, rapidly drops at operation at higher frequencies thereby greatly decreasing the advantage of the higher frequency operation.

In view of the above computations, I have sought techniques and apparatus for reducing the RF power losses due to conductivity of the sample. I have postulated several approaches to accomplish the objective which entail reducing the electrical current paths in the sample.

By replacing a single sample tube by a sample cell that occupies the same total volume of space, but has N smaller diameter compartments, the sample losses are reduced by the increased values of Qs. The power absorbed by the sample in a sample cell with N cylindrical compartments each with a radius b, by analogy to Eq. 7 is given by $$Psc = N \frac{\pi}{8} \sigma \omega^2 B_1^2 L b^4. \quad (13)$$

Substituting Eq. 13 and Eq. 5 into Eq. 2 yields $$Qsc = \frac{4a^2}{N\eta \mu_0 \sigma \omega^2 b^4} = \frac{a^4}{Nb^4} Q_{SA} = q_c Q_{SA} \quad (14)$$

The total sample volume of the N compartments to that of a single sample tube is the relative filling factor $\eta_c$ and the relative ratio of $Q_{SC}/Q_{SA} = q_c$, where $$\eta_c = N \left[ \frac{b}{a} \right] \text{ and } q_c = \frac{a^4}{Nb^4}. \quad (15)$$

With these values the SNR for the cylindrical sample cell can be determined from the equations $$SNR_A = \frac{\eta c}{\sqrt{1 + \frac{300}{q_c Q_{SA}}}} \text{ and} \quad (16)$$

$$SNR_L = \frac{10\eta c}{\sqrt{1 + \frac{6 \times 10^4}{q_c Q_{SA}}}}$$

Further, if the volume were the same so that $N b^2 = a^2$, then QSC=N QSA and the SNR would increase by $\sqrt{N}$. Unfortunately this cannot be fully achieved since the entire volume available for the sample cell is fixed so some volume is lost due to the material that divides the sample into separate compartments. However, with a smaller sample volume the increase in Qsc is even greater than N, and for many cases with lossy samples the gain in SNR can be substantial. Several compartmented sample cells are analyzed to show how they improve SNR.

Figure 3A:
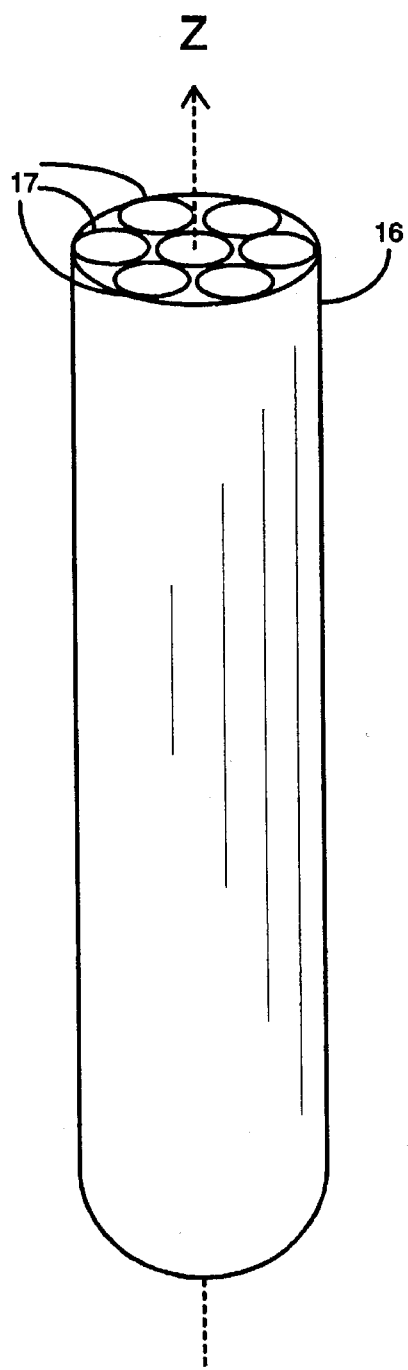
FIG. 3A is sketch of one embodiment of the invention of a NMR sample cell incorporating seven cylindrical compartments.
Figure 3B:
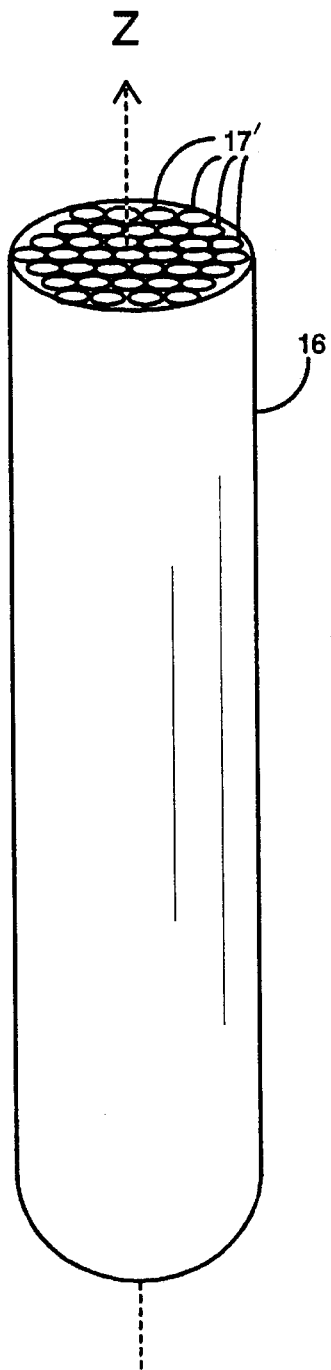
FIG. 3B is sketch of an embodiment of a sample cell incorporating 37 cylindrical compartments.
Figure 3C:
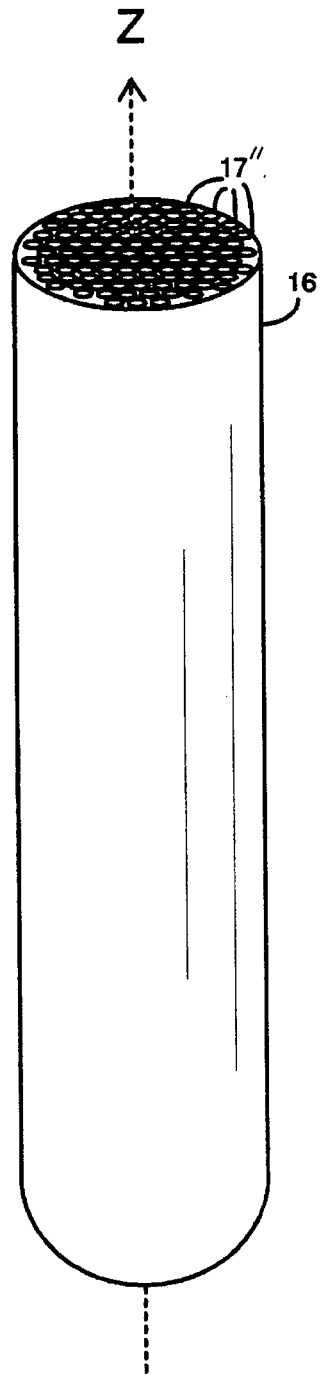
FIG. 3C is a sketch of an embodiment incorporating approximately 100 cylindrical compartments.

One embodiment of such cells is illustrated in FIG. 3A. The sample tube exterior wall thickness is not shown in these Figures. Here 7 cylindrical elongated compartments 17 are contained in the space that would be occupied by a single sample tube. Sample cells with more cylindrical compartments 17' and 17" are illustrated in FIGS. 3B and 3C. The compartments are elongated along the Z-axis which is along the direction of the strong uniform magnetic field $B_0$. This alignment with the magnetic field reduces distortions due to differences of magnetic susceptibility between the sample material and the construction material of the cell. The cell compartments may have many different cross sections such as illustrated in FIG. 3A to FIG. 6E. Except at the two ends, the walls of the cells are parallel to the direction of the main magnetic field $B_0$. The cell compartments in FIGS. 3A–3C are cylindrical cavities which typically are closed at one end and left open for sample filling at the other. The length of a cell is typically 10–15 cm long with outside diameters 3 to 10 mm, so the length to diameter ratio is normally greater than 10.

The gain in sensitivity comes about because the cell walls limit the currents induced by the RF magnetic field, $B_1$ whose field is along the X-axis and perpendicular to the main field $B_0$. The RF magnetic field $B_1$ induces an electric field that drives the current around the periphery of the cell compartments. The strength of the driving potential around the loop is proportional to rate of change of total magnetic flux through the loop, and thus the area of the loop since the magnetic field $B_1$ is fairly uniform in this area. The induced electric field is always perpendicular to the direction of the RF field $B_1$. By limiting the compartment radius, the maximum current is limited thereby limiting the total power dissipation. However, only one dimension perpendicular to $B_1$ needs to be limited to reduce the power dissipation. The dimension that is limited by the embodiments of FIGS. 3A through 4C of this invention is at right angles to the $B_1$ and to the field constant field $B_0$. If the sample is spun about the Z-axis then both the X and Y dimensions of the sample cell compartments must be limited.

There is a reduction of sensitivity that comes about from the smaller volume of the compartmented cell. For solvents with little or no dielectric loss such as carbon tetrachloride it would be disadvantageous to use a compartmented cell as the currents are already sufficiently weak because of the low electrical conductivity of the sample material. For samples of biological materials that might be dissolved in a salt water solution to approximate body fluids one can achieve an important gain in sensitivity at the normal magnetic field strengths (and RF frequencies) used to study these materials using smaller volume cells.

FIG. 3A is a sketch of a sample cell with N=7 cylindrical compartments. For this embodiment the cell diameter, $2a$, must be equal to 3 times the compartment diameter, i.e. $6b$, plus the thickness of the two inner wall, $2t$. Thus the radius of each cell compartment, $b = (a-t)/3$. With $a=2.1$ mm and $t=0.1$ mm, then the compartment radius $b=⅔$ min. Eq. 15 shows $q_c=14$ and $\eta_c=N\ b^2/a^2=0.71$.

FIG. 3B is a sketch of a sample cell with 37 cylindrical compartments. For this cell $a=7b+3t$, so that $b=0.257$ mm. The filling factor is reduced by $\eta_c=0.554$. On the other hand $q_c$ is much larger, i.e. $q_c=120$.

FIG. 3C is a sketch of a sample cell with approximately 100 compartments. For this cell the compartment radius b=0.18 mm and t=0.04 mm. Its filling factor $\eta_c$=0.7, and $q_c$=185.

The performance of each of these cells of FIG. 3A–3C are evaluated in Table II for 600 MHz.

TABLE II

Sample cells with cylindrical compartments.

| Solvent | Dielectric constant mhos/m | FIG. 3A SNR$_A$ | FIG. 3A SNR$_L$ | FIG. 3B SNR$_A$ | FIG. 3B SNR$_L$ | FIG. 3C SNR$_A$ | FIG. 3C SNR$_L$ |
|---|---|---|---|---|---|---|---|
| C Cl4 | 7.2 × 10⁻⁶ | 0.71 | 7.1 | 0.55 | 5.5 | 0.70 | 7.0 |
| Water | 4.1 × 10⁻² | 0.71 | 5.8 | 0.55 | 5.4 | 0.70 | 6.9 |
| Methanol | 8.2 × 10⁻² | 0.71 | 5.1 | 0.55 | 4.9 | 0.70 | 6.8 |
| Ethanol | 0.2 | 0.71 | 3.9 | 0.55 | 2.9 | 0.70 | 6.4 |
| 0.1M NaCl | 2.0 | 0.67 | 1.5 | 0.54 | 1.9 | 0.70 | 4.3 |
| 0.3M NaCl | 5.7 | 0.62 | 0.9 | 0.54 | 1.6 | 0.69 | 2.9 |
| 0.5M NaCl | 9.0 | 0.58 | 0.7 | 0.50 | 0.8 | 0.69 | 2.4 |

The results show that for ambient temperature probes the sample cells of FIGS. 3B and 3C offer SNR advantage over the simple sample tube only for very lossy samples. All three cells show a definite SNR advantage for lossy samples for the low temperature probe. As indicated above, the compartmented cells show a loss of sensitivity for non-lossy samples because of their smaller sample volume.

There are a number of ways compartmented cells with cylindrical cross-section can be constructed. For large cells with few compartments, such as FIG. 3A, glass or ceramic may be hot extruded through a suitable die. For finer compartments, such as in FIGS. 3B and 3C, they may be assembled from fused quartz or glass capillaries. The capillaries may be made by hot stretching performed tubes. Such tubes used in large volume in commercial liquid chromatography and in capillary zone electrophoresis instruments. They are also used to transport and focus X-rays. The tubes can be purchased from Pollymicro Technologies, Inc. of Vista Calif. For example their product TSG530660 is a fused quartz capillary tubing that could be used to fabricate a cell similar to that of FIG. 3B. Smaller capillary tubing has been used in X-ray applications. For example, M. A. Kumakhov and F. F. Komarov, ("Physics Reports", a review section of *Physics. Letter*, 119(5), (August 1990), 289–350) describe using capillary tubes to form an X-ray line. They assembled a bundle of 2000 hollow glass capillaries of 98 cm length with internal radius of 0.18 mm and outer radius of 0.2 mm. that had a transparency $\eta_c$=0.7. The sample cell similar to FIG. 3C could be constructed using such capillaries as a micro channel plate.

Figure 4A:
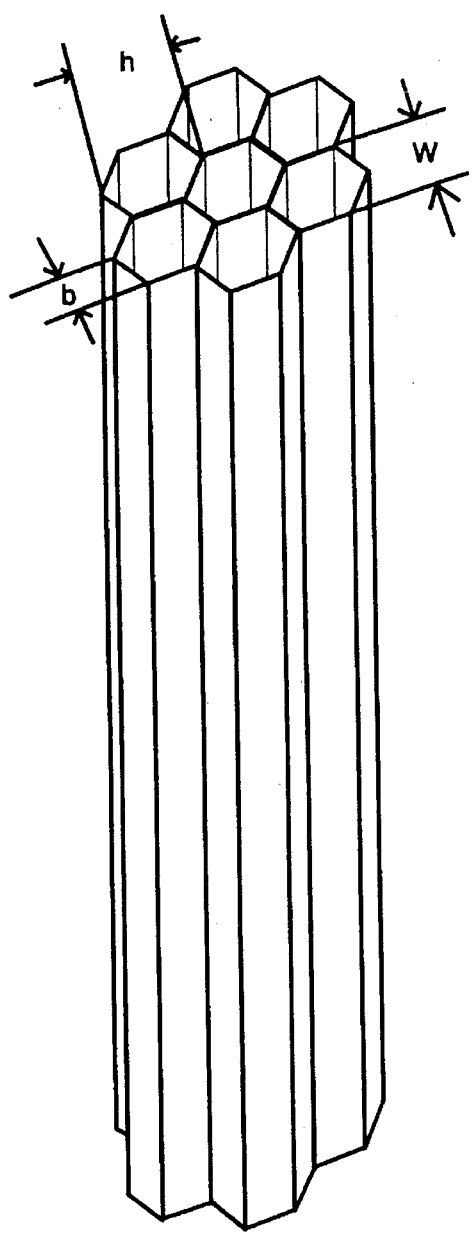
FIG. 4A is a sketch of another embodiment of a sample cell utilizing 7 hexagonal compartments.
Figure 4C:
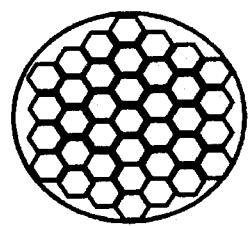
FIG. 4C is a sketch of a top view of a sample cell incorporating hexagonal compartments.
Figure 4B:
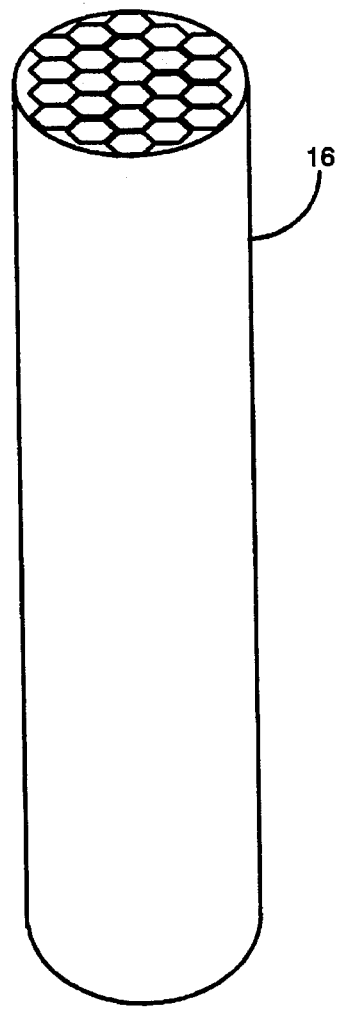
FIG. 4B is a sketch of an embodiment of a sample cell incorporating 37 hexagonal compartments.

Another type of compartmented cell consists of compartments with hexagonal compartments. For a given wall thickness, such compartmented cells have a higher filling factor since more space in the cell is used to contain the sample. As in the case of the round cells, the hexagonal compartmented cells are elongated in the Z-direction with the sides of the cells parallel to the applied magnetic field $B_0$ which is along the Z-direction. FIGS. 4A and 4B are sketches of such a cell. The cross sections of each compartment forms a regular hexagon with side length b.

The power absorbed by N hexagonal compartments is found by using rectangular coordinates rather than the polar coordinates of Eq. 7. With rectangular coordinates, the power adsorbed Ps, can be written as follows:

$$Ps = \frac{N}{6} \sigma\omega^2 B_1^2 L \int [y(x)]^3 dx = \frac{N}{6} \sigma\omega^2 B_1^2 L \left[ \frac{15}{16} \sqrt{3} \, b^4 \right]. \quad (17)$$

Here the term in the bracket is the integral evaluated over a hexagon with sides of length b. It doesn't matter which way the hexagonal is oriented in the X–Y plane, the answer is the same. The Q enhancement ratio $q_H$ for a sample cell with N hexagonal compartments is just the ratio of Eq. 13 to Eq. 17, i.e.

$$q_H = \frac{4\pi}{5\sqrt{3} \, N} \left[ \frac{a}{b} \right]^4 = \frac{1.45}{N} \left[ \frac{a}{b} \right]^4 \quad (18)$$

The total volume, V, enclosed by N hexagonal compartments is given by:

$$v = \frac{3N}{2} \sqrt{3} \, b^2 L.$$

Comparing this to the volume of the simple sample tube $\pi a^2 L$ gives a relative filling factor $N_H$, given by $$\eta_H = \frac{3\sqrt{3} \, N}{2\pi} \left[ \frac{b}{a} \right]^2 = 0.827 N \left[ \frac{b}{a} \right]^2. \quad (19)$$

The hexagonal sample cell illustrated in FIG. 4A has N=7 compartments. Each cell has a width w=√3 b and is 3 cells across plus a total wall thickness of 2t, two wall thicknesses. The condition that the cell occupies a space no larger than a simple sample tube of radius a is that b=2(a−t)/(3√3). With a=2.1 mm, t=0.1 mm, b=0.77 mm, for this sample cell $\eta_H$=0.78 and $q_H$=11.5. The SNR of this cell for various solvents are listed in Table III. FIG. 4B illustrates a hexagonal sample cell with N=37 compartments. The length of each side of this hexagonal compartment b=2(a−3 t)/7 √3=0.297 mm. For this sample cell $\eta_H$=0.612, $q_H$=98. The SNR of this cell is also listed in Table III.

TABLE III

SNR for hexagonal sample cells.

| Solvent | (mhos/m) | FIG. 4A SNR$_A$ | FIG. 4A SNR$_L$ | FIG. 4B SNR$_A$ | FIG. 4B SNR$_L$ |
|---|---|---|---|---|---|
| C Cl4 | 7.2 × 10⁻⁶ | 0.78 | 7.8 | 0.61 | 6.1 |
| Water | 2.1 × 10⁻² | 0.78 | 6.2 | 0.61 | 5.9 |
| Methanol | 4.1 × 10⁻² | 0.78 | 5.4 | 0.61 | 5.8 |
| Ethanol | 0.1 | 0.77 | 4.0 | 0.61 | 5.3 |
| 0.1M NaCl | 1.0 | 0.73 | 1.5 | 0.61 | 3.0 |
| 0.3M NaCl | 2.8 | 0.66 | 0.9 | 0.60 | 1.9 |
| 0.5M NaCl | 4.5 | 0.61 | 0.7 | 0.59 | 1.6 |

The hexagonal compartments give a better filling factor than the cylindrical compartments. The sample cells of FIGS. 4A and 4B have the same number of compartments as the cells in FIGS. 3A and 3B respectively. Although the Q multiplying factor of the cells of FIGS. 4A and 4B is lower, the relative SNR is greater because of the greater filling factor.

For some experiments sample spinning is not used. For these experiments different cell designs can prove advantageous. One such design is illustrated in FIGS. 5A and 5B. In these sample cells the compartments are elongated along the X-axis, i.e. parallel to the RF magnetic field $B_1$. This is feasible since no currents are established in the direction of the magnetic field, $B_1$.

FIG. 5A is one such design. As indicated the probe must be carefully aligned so that RF magnetic field $B_1$ is parallel to the long wall of the cell cross-section. Separate integrations must be carried out over each of the cavities using the integral indicated in Eq. 17. The width of each cell w satisfies the equation N w+(N−1)t=2 a. For the analysis of sample cell illustrated in FIG. 5A, N=4, t=0.1 mm, a=2.1 mm and w=0.974 mm. In FIG. 5B, N=8, t=0.1 mm, a=2.1 mm and w=0.44 mm. The performance of these two sample cells are displayed in Table IV. The main advantage of this type of sample cell is the increase in filling factor over the cells of FIGS. 3 and 4. It is noted however the cells must be carefully aligned so the wide dimension of the cell is parallel to the RF magnetic field $B_1$.

TABLE IV

SNR for sample compartments with elongated cross sections.

| Solvent | (mhos/m) | FIG. 5A $SNR_A$ | FIG. 5A $SNR_L$ | FIG. 5B $SNR_A$ | FIG. 5B $SNR_L$ |
|---|---|---|---|---|---|
| C Cl4 | $7.2 \times 10^{-6}$ | 0.92 | 9.2 | 0.89 | 8.9 |
| Water | $2.1 \times 10^{-2}$ | 0.92 | 7.9 | 0.89 | 8.6 |
| Methanol | $4.1 \times 10^{-2}$ | 0.92 | 7.0 | 0.89 | 8.3 |
| Ethanol | 0.1 | 0.92 | 5.5 | 0.89 | 7.6 |
| 0.1M NaCl | 1.0 | 0.88 | 2.1 | 0.88 | 4.2 |
| 0.3M NaCl | 2.8 | 0.82 | 1.2 | 0.87 | 2.7 |
| 0.5M NaCl | 4.5 | 0.78 | 1.0 | 0.85 | 2.2 |

Figure 6A:
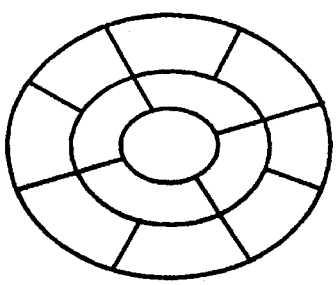
FIG. 6A is a top view of another embodiment of a sample cell incorporating concentric cylinders, some of which are further partitioned by radial walls.
Figure 6E:
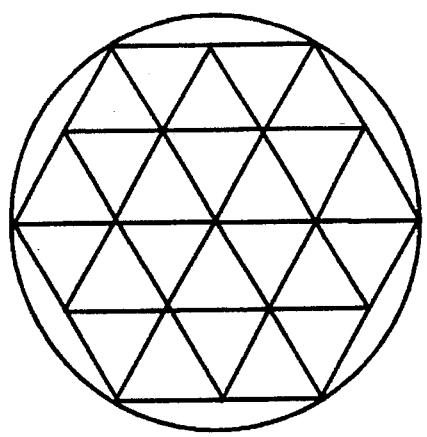
FIG. 6E is the top view of a sample cell incorporating triangular compartments.
Figure 6B:
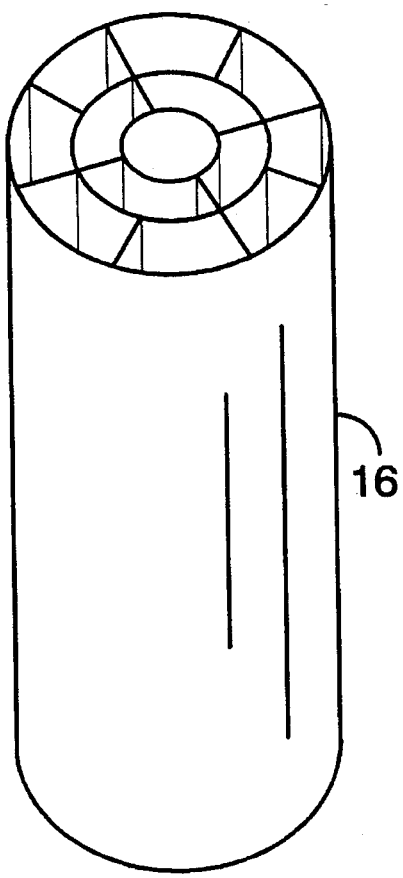
FIG. 6B is a prospective sketch of a sample tube of FIG. 6A.
Figure 6D:
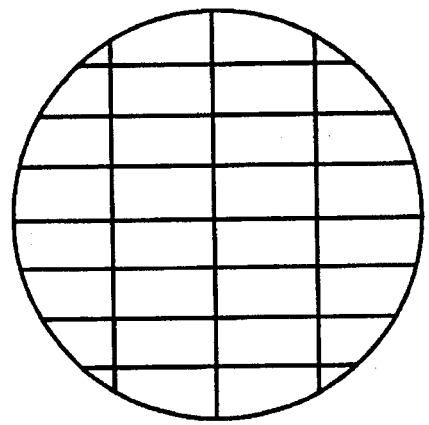
FIG. 6D is the top view of a sample cell incorporating rectangular compartments.
Figure 6C:
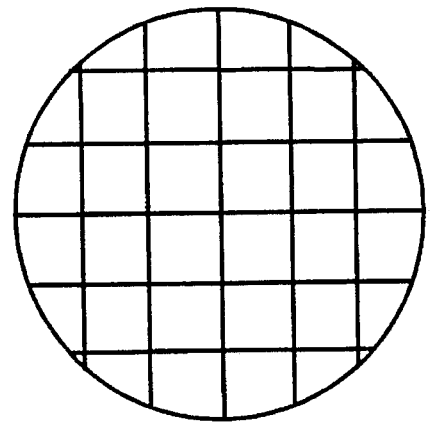
FIG. 6C is the top view of a sample cell incorporating square compartments.

Only a few of the possible shapes of the compartments of sample cells have been described. Some of the other possible shapes with relatively high filling factors are illustrated in FIGS. 6A–6C. FIG. 6A shows the top view of a cell with concentric cylinders and radial partitions to limit any induced currents. FIG. 6B is another view of the same cell. Cells can also be made with square partitions as sketched in FIG. 6C. Cells with rectangular compartments are sketched in FIG. 6D. This cell would primarily be used for non-spinning samples, and could provide a greater filling factor if its narrow width were the same as the compartment width of square cell of FIG. 6C. Another possibility of cell compartment construction is that of triangular compartment cross sections as sketched in FIG. 6E. Many different cell geometries may be used and fall within the scope of my invention. The main features of the invention is that the cell compartments have their long dimension parallel to the constant magnetic field $B_0$, and their short dimension perpendicular to the RF field $B_1$.

The analysis in this specification has been made using a 4.2 mm space which corresponds to the inside diameter of only one of a number of sizes currently in use. Larger diameter sample spaces will benefit from the specialized sample cells to even a greater extent since generally they provide closer coupling to the probe coil and the Q reduction is a greater problem. The filling factors of a given sample cell can also be improved because the wall thickness does not need to be scaled proportionately.

There are a number of techniques that can be used to fabricate sample cells. For the larger cells a glass or ceramic can be hot extruded through a die. Hollow fibers, such as those used in capillary zone electrophoresis can be assembled and packed into a standard sample tube, or be contained within a piece of heat shrink tubing. Several techniques used in making microchannel plates are known and may be suitable. One method uses small size hollow square tubes that are fused together to obtain uniform open channel diameters. Other techniques for microchannel plate assembly use temperature and pressure fusing process in which small diameter glass tubes with solid cores are fused together and to a border.

In the designs illustrated in FIGS. 3A and 4A, the cells did not extend to the edge defined by a simple sample tube. Additional filling factor may be gained by filling up this space with somewhat smaller compartments that extend to the edge as is illustrated in FIG. 4C.

My invention is not restricted to the apparatus and methods described above since these are only embodiments of my invention. It is intended that the scope of my invention be construed by my claims.

What is claimed is:

1. In an NMR probe having an elongated aperture for holding a sample tube, where said sample tube has an axis and where said sample tube fits into said NMR probe aperture, said NMR probe designed for insertion into a fixed $B_0$ homogenous magnetic field produced within a cylindrically wound superconducting magnet, said probe including coil means for exciting said sample with radio frequency excitation and for receiving radio frequency energy from precessing sample nuclei, said sample tube being a thin-walled structure having a first cross-sectional area perpendicular to said axis, THE IMPROVEMENT COMPRISING:
said coil means being constructed of superconducting material and comprising a pair of physically separated loops;
a low temperature Dewar;
said pair of separated loops being mounted within said low temperature Dewar, said low temperature Dewar including a wall having thickness, said Dewar wall being intermediate said superconducting loops and said sample tube resulting in a lower filling factor; and
means for compensating for said lower filling factor, said means for compensating for said lower filling factor including means for reducing Joule energy losses in said sample, said Joule energy loss reducing means including a plurality of parallel elongated chambers in said sample tube for containing said sample in solution in a plurality of volumes, each volume having a cross-sectional area less than said first cross-sectional area.

2. In the NMR probe of claim 1 where sample spinning is not employed, said sample tube having parallel, elongated chambers with non-circular cross-sections, where h is one dimension of said cross-section and w is the dimension perpendicular to h of said cross-section and where the ratio of h/w is greater than 1.5 chambers is hexagonal.

3. In the NMR probe of claim 1 where sample spinning is employed, said sample tube having parallel elongated chambers with uniform cross-sections, where h is one dimension of said cross-section and w is the dimension perpendicular to h and where the ratio of h/w is less than 1.5.

4. The probe of claim 3 where h=w.

5. The probe of claim 3 where h/w is 2/√3 and where the cross-section of said chambers is hexagonal.

6. The method of analyzing a liquid sample within an NMR instrument comprising dividing said sample into a plurality of portions of substantially equal amounts, confining each said portion to a separate region of substantially axial extent, said axial extent much larger than the radial extent thereof, disposing each said sample portion in contiguous parallel relationship within said NMR instrument and performing the NMR measurement thereon, whereby filling factor for said sample is substantially preserved with reduced Joule energy loss within said sample.

7. A new use for a microchannel plate comprising:

spinning a test tube about its axis in an NMR probe in a main $B_0$ field, said test tube containing a microchannel plate means having many parallel elongated channels, said elongated channels of said microchannel plate means designed to retain a polar solution;

exciting an NMR resonance in said polar solution with RF energy; and detecting the NMR response from said polar solution.

8. The new use of claim 7 wherein each said elongated channel has an axis, wherein said tube axis and said elongated channel axes are parallel, and wherein said main field $B_0$ is aligned parallel with said tube and channel axes and where said microchannel plate essentially completely fills the test tube to increase the filling factor.

* * * * *